(12) United States Patent
Yang et al.

(10) Patent No.: US 11,302,639 B2
(45) Date of Patent: Apr. 12, 2022

(54) FOOTING FLARE PEDESTAL STRUCTURE

(71) Applicant: International Business Machines Corporation, Armonk, NY (US)

(72) Inventors: Chih-Chao Yang, Glenmont, NY (US); Baozhen Li, South Burlington, VT (US); Ashim Dutta, Menands, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 16/744,960

(22) Filed: Jan. 16, 2020

(65) Prior Publication Data

US 2021/0225774 A1 Jul. 22, 2021

(51) Int. Cl.

| | | |
|---|---|---|
| *H01L 23/532* | (2006.01) | |
| *H01L 23/522* | (2006.01) | |
| *H01L 43/08* | (2006.01) | |
| *H01L 27/11597* | (2017.01) | |
| *H01L 45/00* | (2006.01) | |
| *H01L 43/02* | (2006.01) | |
| *H01L 43/12* | (2006.01) | |
| *H01L 27/22* | (2006.01) | |
| *H01L 27/24* | (2006.01) | |

(52) U.S. Cl.
CPC .... *H01L 23/53266* (2013.01); *H01L 23/5226* (2013.01); *H01L 23/53261* (2013.01); *H01L 27/11597* (2013.01); *H01L 27/222* (2013.01); *H01L 27/2481* (2013.01); *H01L 43/02* (2013.01); *H01L 43/08* (2013.01); *H01L 43/12* (2013.01); *H01L 45/06* (2013.01); *H01L 45/122* (2013.01); *H01L 45/16* (2013.01)

(58) Field of Classification Search
CPC .................................................. H01L 23/5326
See application file for complete search history.

(56) References Cited

U.S. PATENT DOCUMENTS

| | | | |
|---|---|---|---|
| 3,808,680 | A | 5/1974 | Lafrate et al. |
| 5,691,238 | A | 11/1997 | Avanzino et al. |
| 8,357,609 | B2 | 1/2013 | Ryan |
| 8,866,242 | B2 | 10/2014 | Li et al. |
| 9,865,649 | B2 | 1/2018 | Tan et al. |
| 9,893,120 | B2 | 2/2018 | Chuang et al. |
| 9,893,278 | B1 | 2/2018 | Chuang et al. |
| 2001/0050385 | A1 | 12/2001 | Kotecki et al. |

(Continued)

FOREIGN PATENT DOCUMENTS

WO 2015026390 A1 2/2015

*Primary Examiner* — Mounir S Amer

(74) *Attorney, Agent, or Firm* — Scully, Scott, Murphy & Presser, P.C.; L. Jeffrey Kelly, Esq.

(57) ABSTRACT

Re-depositing of metal-containing particles of an embedded electrically conductive structure onto sidewalls of an overlying metal-containing structure is alleviated in the present application by providing a pedestal structure between the embedded electrically conductive structure and the metal-containing structure, wherein the pedestal structure has a flared sidewall that extends beyond a perimeter of the embedded electrically conductive structure. Such a pedestal structure (which can be referred to herein as a footing flare pedestal structure) mitigates, and in some embodiments, entirely eliminates, the exposure of the embedded electrically conductive structure during the patterning of metal-containing layers formed atop the embedded electrically conductive structure.

10 Claims, 4 Drawing Sheets

(56) References Cited

U.S. PATENT DOCUMENTS

| | | |
|---|---|---|
| 2012/0080793 A1 | 4/2012 | Danek et al. |
| 2015/0171314 A1 | 6/2015 | Li et al. |
| 2017/0018704 A1 | 1/2017 | Chuang et al. |
| 2017/0069684 A1 | 3/2017 | Suh et al. |
| 2017/0301728 A1* | 10/2017 | Chuang .................. H01L 43/02 |
| 2018/0040668 A1* | 2/2018 | Park ..................... G11C 11/161 |
| 2018/0197915 A1 | 7/2018 | Briggs et al. |
| 2018/0261759 A1 | 9/2018 | Bhosale et al. |
| 2018/0351081 A1 | 12/2018 | Sung et al. |
| 2019/0081233 A1 | 3/2019 | Lee et al. |
| 2020/0106000 A1* | 4/2020 | Chiu .................... H01L 27/222 |

* cited by examiner

FOOTING FLARE PEDESTAL STRUCTURE

BACKGROUND

The present application relates to back-end-of-the-line (BEOL) technology, and more particularly to an interconnect structure or a memory structure that is formed in the BEOL.

One challenge in forming interconnect structures or memory structures in the BEOL is that during the patterning of metal-containing layers, which are located above an embedded electrically conductive structure, the embedded electrically conductive structure is typically exposed to the etching process used to pattern the metal-containing layers. Such exposure of the embedded electrically conductive structure during the patterning of the metal-containing layers can cause unwanted metal-containing particles of the embedded electrically conductive structure to re-deposit onto the sidewalls of the patterned metal-containing layers. Such re-deposited metal-containing particles can cause deleterious effects to the resultant interconnect structure or memory structure that is formed in the BEOL.

There is thus a need for providing an interconnect structure or memory structure in the BEOL in which re-depositing of metal-containing particles onto the sidewalls of metal-containing layers is substantially, or entirely, eliminated.

SUMMARY

Re-depositing of metal-containing particles of an embedded electrically conductive structure onto sidewalls of an overlying metal-containing structure is alleviated in the present application by providing a pedestal structure between the embedded electrically conductive structure and the metal-containing structure, wherein the pedestal structure has a flared sidewall that extends beyond a perimeter of the embedded electrically conductive structure. Such a pedestal structure (which can be referred to herein as a footing flare pedestal structure) mitigates, and in some embodiments, entirely eliminates, the exposure of the embedded electrically conductive structure during the patterning of metal-containing layers formed atop the embedded electrically conductive structure.

In one aspect of the present application, a structure (interconnect or memory) is provided. In one embodiment of the present application, the structure includes a first electrically conductive structure embedded in a first interconnect dielectric material layer. A pedestal structure is located on the first electrically conductive structure, wherein the pedestal structure has a flared sidewall that extends beyond a perimeter of the first electrically conductive structure. A metal-containing structure is located on the pedestal structure. A second electrically conductive structure is located on the metal-containing structure. A second interconnect dielectric material layer is present on the first interconnect dielectric material layer and located laterally adjacent to the pedestal structure, the metal-containing structure and the second electrically conductive structure.

In another aspect of the present application, a method of forming a structure (interconnect or memory) in the BEOL is provided. In one embodiment, the method includes forming a first electrically conductive structure in a first interconnect dielectric material layer. A first metal-containing layer is formed on the first electrically conductive structure and on the first interconnect dielectric material layer, and then a second metal-containing layer is formed on the first metal-containing layer. The second metal-containing layer and the first metal-containing layer are then patterned to provide a patterned structure composed of a remaining portion of the second metal-containing layer and a remaining portion of the first metal-containing layer, wherein the remaining portion of the first metal-containing layer has a flared sidewall that extends beyond a perimeter of the first electrically conductive structure. Next, a second interconnect dielectric material layer is formed on the first interconnect dielectric material layer, and laterally adjacent to, and above, the patterned structure, and thereafter a second electrically conductive structure is formed in the second interconnect dielectric material layer and contacting a surface of the remaining portion of the second metal-containing layer of the patterned structure.

DETAILED DESCRIPTION

Figure 1:
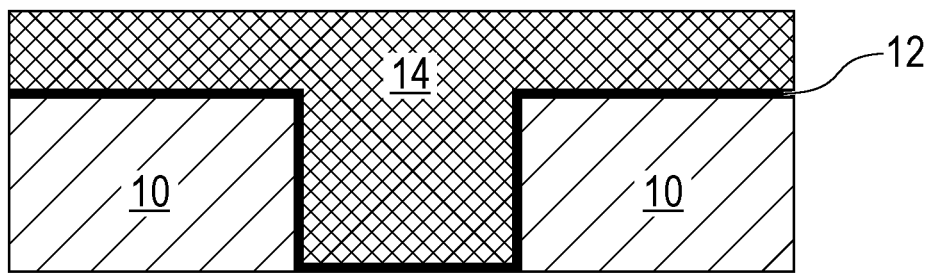
FIG. 1 is a cross sectional view of an exemplary structure that can be employed in accordance with an embodiment of the present application, wherein the exemplary structure includes a first interconnect dielectric material layer having an opening, a diffusion barrier material layer lining the opening and present on a topmost surface of the first interconnect dielectric material layer, and a first electrically conductive metal-containing layer located on the diffusion barrier material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in accordance with an embodiment of the present application. The exemplary structure of FIG. 1 is present in the BEOL and includes a first interconnect dielectric material layer 10 having an opening (not specifically show), a diffusion barrier material layer 12 lining the opening and present on a topmost surface of the first interconnect dielectric material layer 10, and a first electrically conductive metal-containing layer 14 located on the diffusion barrier material layer 12. In some embodiments, the diffusion barrier material layer 12 can be omitted.

Although the present application describes and illustrates a single opening present in the first interconnect dielectric material layer 10, the present application can be employed in embodiments in which a plurality of openings are formed into the first interconnect dielectric material layer 10.

The first interconnect dielectric material layer 10 is present in the BEOL and is formed on a substrate (not shown). The substrate (not shown) can include a lower interconnect level, and/or a middle-of-line (MOL) level and/or a front-end-of-the-line structure. The front-end-of-the-line structure includes a semiconductor substrate that contains a plurality of semiconductor devices formed therein or thereupon. The MOL level includes an MOL dielectric material having at least one contact structure formed therein. The lower interconnect level includes at least one interconnect dielectric material layer having at least one electrically conductive structure embedded therein.

The first interconnect dielectric material layer 10 can be composed of an inorganic dielectric material, an organic dielectric material or a combination of inorganic and organic dielectric materials. In some embodiments, the first interconnect dielectric material layer 10 can be porous. In other embodiments, the first interconnect dielectric material layer 10 can be non-porous. Examples of suitable dielectric materials that can be employed as the first interconnect dielectric material layer 10 include, but are not limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first interconnect dielectric material layer 10 can have a dielectric constant (all dielectric constants mentioned herein are measured relative to a vacuum, unless otherwise stated) that is about 4.0 or less. In one embodiment, the first interconnect dielectric material layer 10 has a dielectric constant of 2.8 or less. These dielectrics generally having a lower parasitic cross talk as compared to dielectric materials whose dielectric constant is greater than 4.0.

The first interconnect dielectric material layer 10 can be formed by a deposition process such as, for example, chemical vapor deposition (CVD), plasma enhanced chemical vapor deposition (PECVD) or spin-on coating. The first interconnect dielectric material layer 10 can have a thickness from 50 nm to 250 nm. Other thicknesses that are lesser than 50 nm, and greater than 250 nm can also be employed in the present application.

After providing the first interconnect dielectric material layer 10, at least one opening (not shown) is formed into the first interconnect dielectric material layer 10; each opening will house a first electrically conductive structure 14S and, if present, a first diffusion barrier liner 12L. In some embodiments, the at least one opening in the first interconnect dielectric material layer 10 is a via opening. The at least one via opening can be formed by lithography and etching. In other embodiments, the at least one opening that is formed in the first interconnect dielectric material layer 10 is a line opening. The line opening can be formed by lithography and etching. In yet further embodiments, the at least one opening that is formed in the first interconnect dielectric material layer 10 is a combined via/line opening. The combined via/line opening can be formed utilizing two lithographic and etching steps.

Diffusion barrier material layer 12 is then typically, but not necessarily always, formed in each opening and on a topmost surface of the first interconnect dielectric material layer 10. The diffusion barrier material layer 12 can be composed of Ta, TaN, Ti, TiN, Ru, RuN, RuTa, RuTaN, W, WN or any other material that can serve as a barrier to prevent a conductive material from diffusing there through. The thickness of the diffusion barrier material layer 12 can vary depending on the deposition process used as well as the material employed. In some embodiments, the diffusion barrier material layer 12 can have a thickness from 2 nm to 50 nm; although other thicknesses for the diffusion barrier material layer 12 are contemplated and can be employed in the present application as long as the diffusion barrier material layer 12 does not entirely fill the opening that is formed into the first interconnect dielectric material layer 10. The diffusion barrier material layer 12 can be formed by a deposition process including, for example, CVD, PECVD, atomic layer deposition (ALD), physical vapor deposition (PVD), sputtering, chemical solution deposition or plating.

In some embodiments, an optional plating seed layer (not specifically shown) can be formed on the surface of the diffusion barrier material layer 12. In some embodiments, the optional plating seed layer is not needed. The optional plating seed layer is employed to selectively promote subsequent electroplating of a pre-selected conductive metal or metal alloy. The optional plating seed layer may be composed of Cu, a Cu alloy, Jr, an Jr alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

First electrically conductive metal-containing layer 14 is formed into each opening and, if present, atop the diffusion barrier material layer 12. The first electrically conductive metal-containing layer 14 is composed of an electrically conductive metal or electrically conductive metal alloy. The electrically conductive metal or electrically conductive metal alloy that provides the first electrically conductive metal-containing layer 14 can be composed of copper (Cu), aluminum (Al), tungsten (W), or an alloy thereof such as, for example, a Cu—Al alloy. The first electrically conductive metal-containing layer 14 can be formed utilizing a deposition process such as, for example, CVD, PECVD, sputtering, chemical solution deposition or plating. In one embodiment, a bottom-up plating process is employed in forming the electrically conductive metal or electrically conductive metal alloy that provides the first electrically conductive metal-containing layer 14. In some embodiments, the electrically conductive metal or electrically conductive metal alloy that provides the first electrically conductive metal-containing layer 14 is formed above the topmost surface of the first interconnect dielectric material layer 10.

Figure 2A:
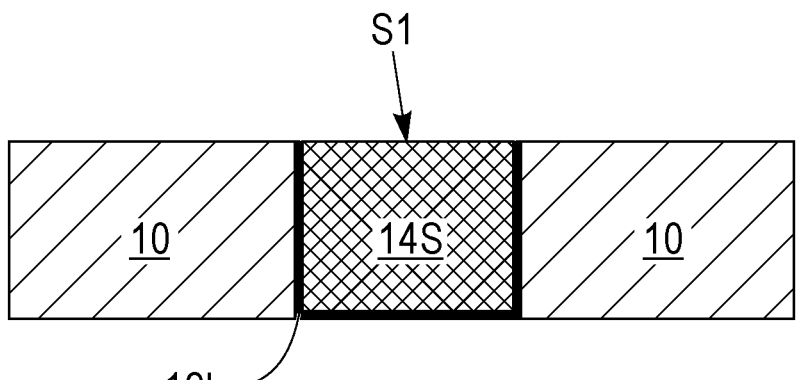
FIG. 2A is a cross sectional view of the exemplary structure of FIG. 1 after performing a planarization process in accordance with one embodiment of the present application; in this embodiment a first electrically conductive structure is provided in the opening that has a topmost surface that is coplanar with a topmost surface of the first interconnect dielectric material layer.

Referring now to FIG. 2A, there is illustrated the exemplary structure of FIG. 1 after performing a planarization process in accordance with one embodiment of the present application. The planarization process that can be used in providing the structure shown in FIG. 2A includes chemical mechanical polishing (CMP) and/or grinding. The planarization process removes the first electrically conductive metal-containing layer 14 and, if present, the diffusion barrier material layer 12 that are present outside each of the openings forming in the first interconnect dielectric material layer 10; the material outside the opening can be referred to as an overburden material. In the illustrated embodiment of FIG. 2A, the planarization stops on a topmost surface of the first interconnect dielectric material layer 10. The remaining portion of the diffusion barrier material layer 12 that is present in the opening is referred to herein as a first diffusion barrier liner 12L, while the remaining first electrically conductive metal-containing layer 14 that is present in the opening is referred to as the first electrically conductive structure 14S.

In this embodiment, the first electrically conductive structure 14S provided in the opening has a topmost surface, S1, that is coplanar with a topmost surface of the first interconnect dielectric material layer 10. Also, and if present, the first diffusion barrier liner 12L that is present in the opening has a topmost surface that is coplanar with a topmost surface of both the first electrically conductive structure 14S and the first interconnect dielectric material layer 10. As is shown, the first diffusion barrier liner 12L is present on the sidewalls and a bottom wall of the first electrically conductive structure 14S.

Figure 2B:
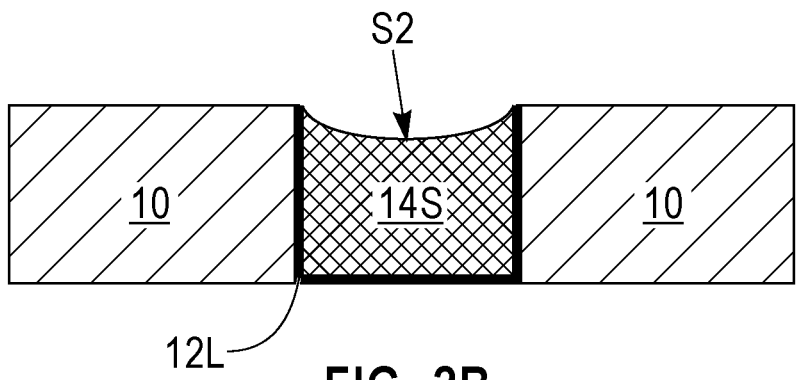
FIG. 2B is a cross sectional view of the exemplary structure of FIG. 1 after providing a first electrically conductive structure that has a recessed upper surface in the opening that is present in the first interconnect dielectric material layer.

Referring now to FIG. 2B, there is illustrated the exemplary structure of FIG. 1 after providing a first electrically conductive structure 14S that has a recessed upper surface, S2, in the opening that is present in the first interconnect dielectric material layer 10. The recessed surface, S2, of the first electrically conductive structure 14S of this embodiment of the present application is a concave upper surface (that is the upper surface of the recessed first electrically conductive structure 14S curves inward to provide a first electrically conductive structure 14S that is thinner in the middle than on the edges).

In some embodiments, the structure shown in FIG. 2B can be formed by first removing the overburdened first electrically conductive-metal containing layer 14 and, if present, the overburdened diffusion barrier material layer 12 from the structure shown in FIG. 1 utilizing a planarization process to provide a structure such as is shown in FIG. 2A. A recess etching process can then be performed on the planarization structure to provide the exemplary structure shown in FIG. 2B. In some embodiments, a block mask can be formed on portions of the structure that are not to contain a first electrically conductive structure 14S having the recessed surface, S2, prior to performing the recess etching process.

In other embodiments, the structure shown in FIG. 2B can formed during the removal of the overburdened first electrically conductive-metal containing layer 14 from the exemplary structure shown in FIG. 1. In such an embodiment, the planarization process itself can provide the first electrically conductive structure having the recessed surface, S2 (i.e., the concave upper surface), shown in FIG. 2B. In such an embodiment, the first electrically conductive structure 14S that is recessed is connected to a large electrically conductive pad of the front-end-of-the-line structure.

Figure 3:
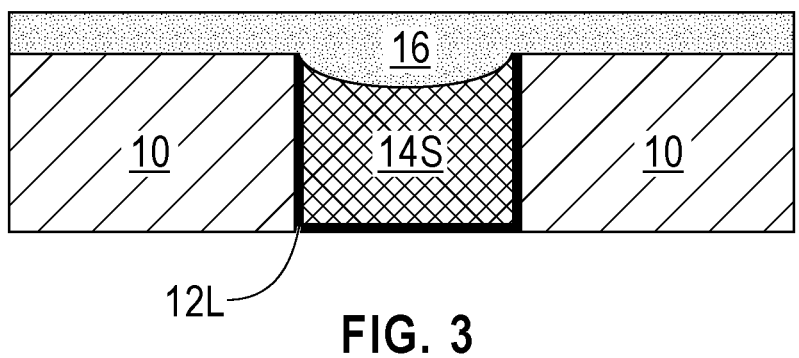
FIG. 3 is a cross sectional view of the exemplary structure of FIG. 2B after forming a first metal-containing layer on the first electrically conductive structure and on the first interconnect dielectric material layer.

Referring now to FIG. 3, there is illustrated the exemplary structure of FIG. 2B after forming a first metal-containing layer 16 on the first electrically conductive structure 14S and on the first interconnect dielectric material layer 10. The first metal-containing layer 16 will be subsequently processed into a pedestal structure 16S having a flared sidewall, S3. Although the first metal-containing layer 16 is shown to be formed on the exemplary structure shown in FIG. 2B, the first metal-containing layer 16 can also be formed on the exemplary structure shown in FIG. 2A of the present application.

In the embodiment shown in FIG. 3, a bottom surface of the first metal-containing layer 16 is formed on the recessed surface, S2 (i.e., the concave upper surface) of the first electrically conductive structure 14S. In other embodiments (not shown), a bottom surface of the first metal-containing layer 16 is formed on the non-recessed topmost surface, Si, of the first electrically conductive structure 14S. In either embodiment, the first metal-containing layer 16 is also formed on a topmost surface of the first interconnect dielectric material layer 10, and, if present, on a topmost surface of the first diffusion barrier liner 12L.

The first metal-containing layer 16 is composed of a metal, such as, for example, Ta, Ti, W, Co, Ru, or Rh, a metal nitride such as, for example, TaN, TiN, WN, CoN, RuN or RhN, or alloys of said metals (Ta and one of Ti, W, Co, Ru, or Rh; Ti and one of Ta, W, Co, Ru, or Rh; W and one of Ta, Ti, Co, Ru or Rh; Co and one of Ta, Ti, W, Ru or Rh; Ru and one of Ta, Ti, W, Co, or Rh; of Rh and one of Ta, Ti, W, Co, or Ru). In some embodiments, the first metal-containing layer 16 can be composed of a metal, M, a metal nitride, MN, or alloys of at least two metals, M1-M2, wherein M, M1 and M2 are selected from the group consisting of Ta, Ti, W, Co, Ru, and Rh, and M1 does not equal M2. The first metal-containing layer 16 is compositionally different from the underlying first electrically conductive structure 14S.

The first metal-containing layer 16 can be formed by a deposition process such as, for example, CVD, PECVD, PVD or ALD. In some embodiments, a planarization process such as, for example, CMP and/or grinding, follows the deposition step. At this junction of the present application, the first metal-containing layer 16 has a topmost surface which extends above the topmost surface of the first interconnect dielectric material layer 10 as is shown, for example, in FIG. 3.

Figure 4:
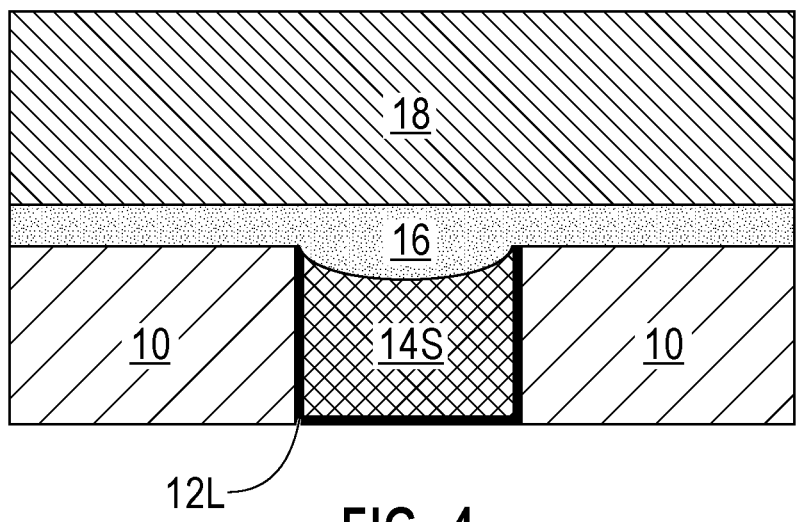
FIG. 4 is a cross sectional view of the exemplary structure of FIG. 3 after forming a second metal-containing layer on the first metal-containing layer.

Referring now to FIG. 4, there is illustrated the exemplary structure of FIG. 3 after forming a second metal-containing layer 18 on the first metal-containing layer 16. The second metal-containing layer 18 is compositionally different from the underlying first metal-containing layer 16. The second metal-containing layer 18 that is employed in the present application is composed of at least one layer of an electrically conductive metal-containing material. The second metal-containing layer 18 can be formed by depositing a layer of the electrically conductive metal-containing material or depositing a material stack of electrically conductive metal-containing materials. In some embodiments, the deposition of the second metal-containing layer 18 occurs within the same reactor chamber as the deposition of the first metal-containing layer 16. In such an embodiment, a vacuum can be maintained between the deposition of the first metal-containing layer 16 and the second metal-containing layer 18.

In one embodiment, the second metal-containing layer 18 is composed of one of the electrically conductive metals or electrically conductive metal alloys as mentioned above for the first electrically conductive structure 14S. In another embodiment, the second metal-containing layer 18 is composed of a stack including one of the electrically conductive metals or electrically conductive metal alloys as mentioned above for the first electrically conductive structure 14S. In yet a further embodiment, the second metal-containing layer 18 is composed of elements of a memory stack that can be used as a non-volatile memory device such as, for example, a ferroelectric memory (FE) device, a resistive random access memory (ReRAM) device, a magnetoresistive random access memory (MRAM) device, or a phase change random access memory (PRAM) device.

A FE memory device is a random access memory similar in construction to a DRAM by using a ferroelectric layer instead of a dielectric layer to achieved non-volatility. FE memory devices typically include a material stack of, from bottom to top, a bottom electrode, a ferroelectric layer, and a top electrode. Thus, and in one embodiment of the present application, the second metal-containing layer 18 can be an electrically conductive metal-containing material stack of a ferroelectric layer, and a top electrode; in such an embodiment, the first metal-containing layer 16 can be used as the bottom electrode of the FE memory device. The top electrode may be composed of a metal or metal nitride. For example, TiN may be used as the material for the top electrode. The ferroelectric layer is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y.

A ReRAM device is a random access memory that typically includes a material stack of, from bottom to top, a bottom electrode, a metal oxide that can exhibit a change in electron localization, and a top electrode. Thus, and in one embodiment of the present application, the second metal-containing layer 18 can be an electrically conductive metal-containing material stack of a ferroelectric layer, and a top electrode; in such an embodiment, the first metal-containing layer 16 can be used as the bottom electrode of the ReRAM device. The top electrode may be composed of a metal or metal nitride. For example, TiN may be used as the material for the top electrode. The metal oxide may include oxides of nickel, zirconium, hafnium, iron, or copper.

A MRAM device is a random access memory that includes a magnetic tunnel junction (MTJ) structure. The magnetic tunnel junction (MTJ) structure includes a magnetic reference layer, a tunnel barrier, and a magnetic free layer. In embodiments in which a MRAM device is to be formed, the second metal-containing layer 18 can include the magnetic reference layer, the tunnel barrier and the magnetic free layer. In such an embodiment, a top electrode layer such as a TiN layer can be included in the second metal-containing layer 18; and the first metal-containing layer 16 can be used as the bottom electrode of the MRAM device.

The magnetic reference layer has a fixed magnetization. The magnetic reference layer is composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the MTJ structure is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The magnetic free layer of the MTJ structure is composed of at least one magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

A PRAM device is a random access memory that typically includes a material stack of, from bottom to top, a bottom electrode, a phase change memory material that exhibits a change in atomic order (from crystalline to amorphous or vice versa), and a top electrode; in such an embodiment, the first metal-containing layer 16 can be used as the bottom electrode of the PRAM device. Thus, and in one embodiment of the present application, the second metal-containing layer 18 is an electrically conductive metal-containing material stack of a ferroelectric layer, and a top electrode. The top electrode may be composed of a metal or metal nitride. For example, TiN may be used as the material for the top electrode. The phase change memory material may include a chalcogenide glass such as, for example, $Ge_2Sb_2Te_5$ or $Ge_2Bi_2Te_6$.

Figure 5A:
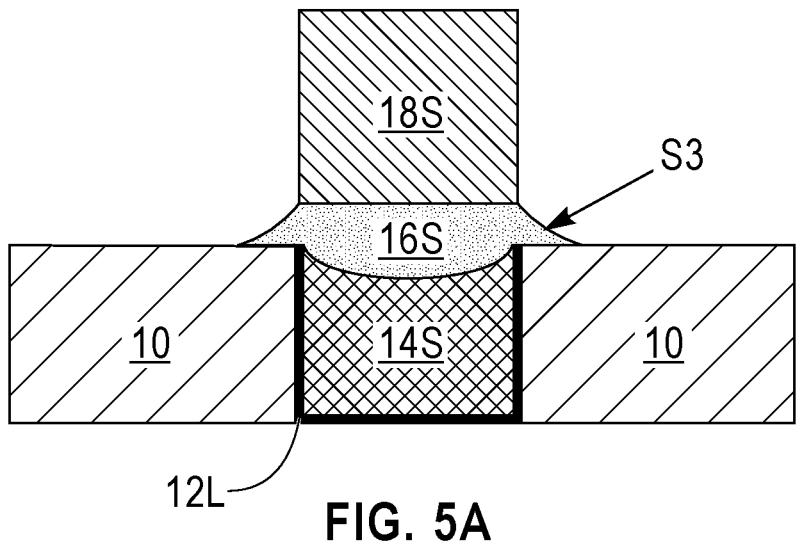
FIG. 5A is a cross sectional view of the exemplary structure of FIG. 4 after patterning the second metal-containing layer and the first metal-containing layer to provide a patterned structure composed of a remaining portion of the second metal-containing layer (i.e., a metal-containing structure) and a remaining portion of the first metal-containing layer (i.e., a pedestal structure).

Referring now to FIG. 5A, there is illustrated the exemplary structure of FIG. 4 after patterning the second metal-containing layer 18 and the first metal-containing layer 16 to provide a patterned structure composed of a remaining portion of the second metal-containing layer 18 (i.e., a metal-containing structure 18S) and a remaining portion of the first metal-containing layer 16 (i.e., a pedestal structure 16S). The pedestal structure 16S has a flared sidewall, S3, that extends outward from a topmost surface of the pedestal structure. The pedestal structure 16S having the flared sidewall, S3, can be referred to a footing flare pedestal structure. The footing flare pedestal structure 16S mitigates, and in some embodiments, entirely eliminates, the exposure of the first electrically conductive structure 14S during the patterning of the second metal-containing layer 18.

The patterning of the second metal-containing layer 18 and the first metal-containing layer 16 includes ion beam etching. In some embodiments, a chemical wet etch is employed prior to the ion beam etch. In other embodiments, the chemical wet etch is omitted. When employed, the chemical wet etch is used to pattern the second metal-containing layer 18 stopping on the first metal-containing layer 16. Ion beam etching is then used to pattern the first metal-containing layer 16.

In accordance with the present application, the pedestal structure 16S has a lateral dimension that is greater than a lateral dimension of the first electrically conductive structure 14S and metal-containing structure 18S. In some embodiments, the lateral dimension of the metal-containing structure 18S can be the same as, or less than, the lateral dimension of the first electrically conductive structure 14S. The metal-containing structure 18S, the first electrically conductive structure 14S and the pedestal structure 16S can be cylindrical in shape; although other shapes are contemplated and can be used for the metal-containing structure 18S, the first electrically conductive structure 14S and the pedestal structure 16S. At this point of the present application, the flared sidewall, S3, of the pedestal structure 16S is present on the planar topmost surface of the first interconnect dielectric material layer 10.

Figure 5B:
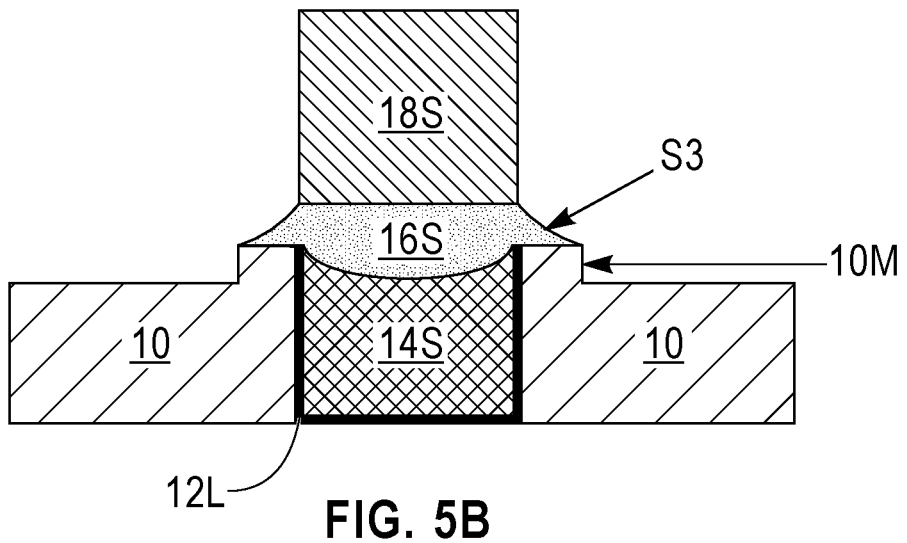
FIG. 5B is a cross sectional view of the exemplary structure of FIG. 5A after recessing physically exposed portions of the first interconnect dielectric material layer, not protected by the patterned structure.

Referring now to FIG. 5B, there is illustrated the exemplary structure of FIG. 5A after recessing physically exposed portions of the first interconnect dielectric material layer 10, not protected by the patterned structure (18S/16S). In some embodiments, the recessing of the physically exposed portions of the first interconnect dielectric material layer 10, not protected by the patterned structure (18S/16S), can be omitted.

When performed, the recessing of the physically exposed portions of the first interconnect dielectric material layer 10 includes a recess etch that is selective in removing the dielectric material that provides the first interconnect dielectric material layer 10 relative to the patterned structure (18S, 16S) which serves as an etch mask during the recess process. The recessing of the physically exposed portions of the first interconnect dielectric material layer 10 provides a mesa portion 10M to the first interconnect dielectric material layer 10. The mesa portion 10M is located directly beneath the flared sidewall, S3, of the pedestal structure 16S. As such and in the illustrated embodiment, the flared sidewall, S3, of the pedestal structure 16S is located on the mesa portion 10M of the first interconnect dielectric material layer 10.

Figure 6:
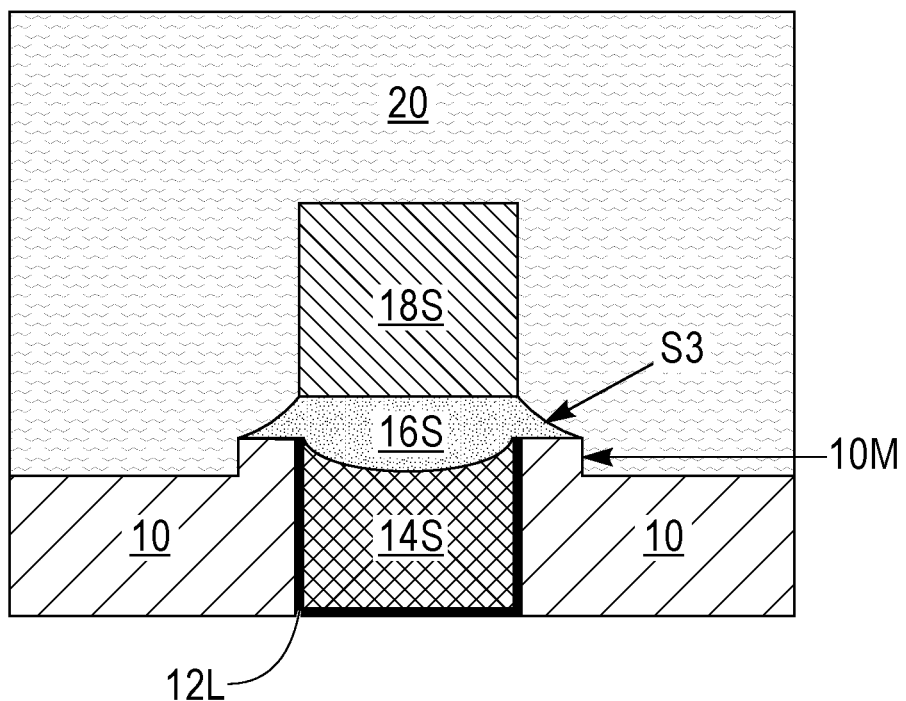
FIG. 6 is a cross sectional view of the exemplary structure of FIG. 5B after forming a second interconnect dielectric material layer on the first interconnect dielectric material layer, and laterally adjacent to, and above, the patterned structure.

Referring now to FIG. 6, there is illustrated the exemplary structure of FIG. 5B after forming a second interconnect dielectric material layer 20 on the first interconnect dielectric material layer 10, and laterally adjacent to, and above, the patterned structure (18S/16S). The second interconnect dielectric material layer 20 is composed of one of the dielectric materials mentioned above for the first interconnect dielectric material layer 10. In one embodiment, the second interconnect dielectric material layer 20 is composed of a dielectric material that is compositionally the same as the dielectric material that provides the first interconnect dielectric material layer 10. In another embodiment, the second interconnect dielectric material layer 20 is composed of a dielectric material that is compositionally different from the dielectric material that provides the first interconnect dielectric material layer 10. The second interconnect dielectric material layer 20 can be formed utilizing one of the deposition processed mentioned above for forming the first interconnect dielectric material layer 10.

Figure 7:
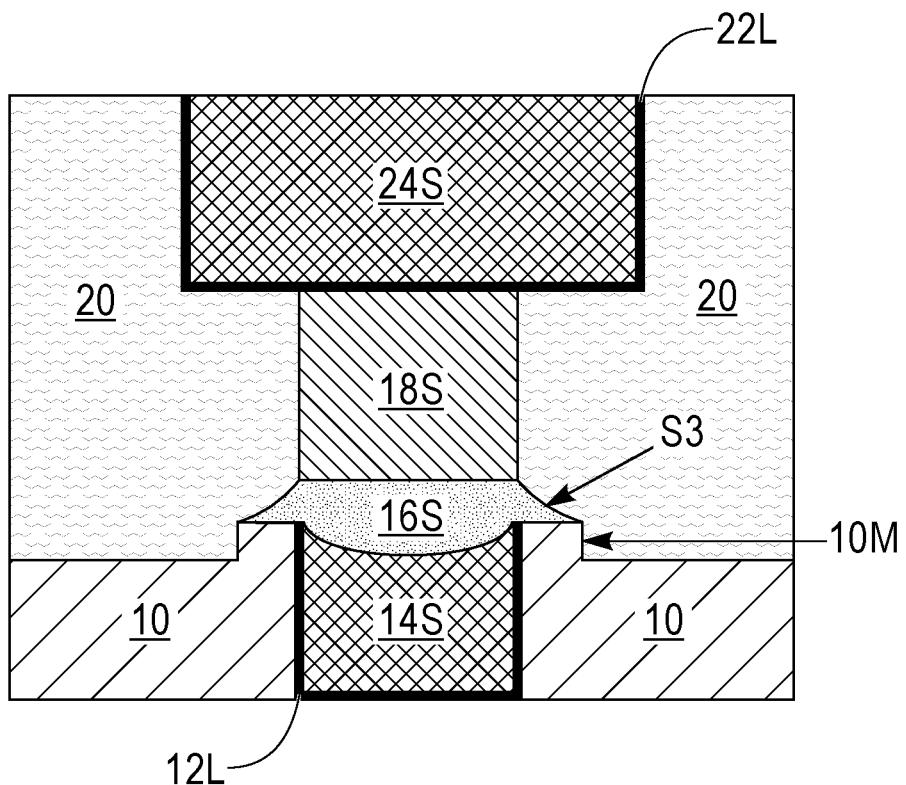
FIG. 7 is a cross sectional view of the exemplary structure of FIG. 6 after forming a second electrically conductive structure in the second interconnect dielectric material layer and contacting a surface of the metal-containing structure of the patterned structure.

Referring now to FIG. 7, there is illustrated the exemplary structure of FIG. 6 after forming a second electrically conductive structure 24S in the second interconnect dielectric material layer 20 and contacting a surface of the metal-containing structure 18S of patterned structure (18S/16S).

The second electrically conductive structure 24S can be formed by first forming an opening (not shown) into the second interconnect dielectric material layer 20. The opening physically exposes a topmost surface of the metal-containing structure 18S of the patterned structure (18S/16S). The opening can be formed by lithography and etching. A second diffusion barrier material layer can then be formed into the opening that is formed into the second interconnect dielectric material layer 20 and atop the second interconnect dielectric material layer. The second diffusion barrier material layer includes one of the diffusion barrier materials mentioned above for providing the first diffusion barrier liner 12L. The diffusion barrier material that provides the second diffusion barrier material layer can be compositionally the same as, or compositionally different from the diffusion barrier material that provides the first diffusion barrier liner 12L. The second diffusion barrier material layer can be formed utilizing one of the deposition processes mentioned above for forming the first diffusion barrier material layer 12. The second diffusion barrier material layer can have a thickness within the range mentioned above for the first diffusion barrier layer 12. In some embodiments, the second diffusion barrier material layer can be omitted.

In some embodiments, an optional plating seed layer (not specifically shown) as defined above can be formed on the surface of the second diffusion barrier material. In some embodiments, the optional plating seed layer is not needed.

Next, a second electrically conductive metal-containing layer is formed into the opening and, if present, atop the second diffusion barrier material layer. The second electrically conductive metal-containing layer can include one of the electrically conductive metals or electrically conductive metal alloys mentioned above for the first electrically conductive metal-containing layer 14. In one embodiment, the second electrically conductive metal or electrically conductive metal alloy that provides the second electrically conductive metal-containing layer is compositionally the same as the electrically conductive metal or metal alloy that provides the first electrically conductive layer 14. In another embodiment, the second electrically conductive metal or electrically conductive metal alloy that provides the second electrically conductive metal-containing layer is compositionally different from the electrically conductive metal or metal alloy that provides the first electrically conductive-metal containing layer 14. The second electrically conductive metal-containing layer can be formed utilizing a deposition process such as, for example, CVD, PECVD, sputtering, chemical solution deposition or plating. In one embodiment, a bottom-up plating process is employed in forming the second electrically conductive metal-containing layer. In some embodiments, the second electrically conductive metal-containing layer is formed above the topmost surface of the second interconnect dielectric material layer 20.

Following the deposition of the second electrically conductive metal-containing layer, a planarization process such as, for example, chemical mechanical polishing (CMP) and/or grinding, can be used to remove all the second electrically conductive metal-containing layer, and if present, the second diffusion barrier layer, that are present outside the opening formed into the second interconnect dielectric material layer 20. The planarization stops on a topmost surface of the second interconnect dielectric material layer 20. Thus, and if present, the planarization process also removes the second diffusion barrier material layer from the topmost surface of the second interconnect dielectric material layer 20. The remaining portion of the second diffusion barrier material layer that is present in the at least one opening is referred to herein as the second diffusion barrier liner 22L, while the remaining second electrically conductive metal-containing layer hat is present in the opening formed in the second interconnect dielectric material layer 20 may be referred to as the second electrically conductive structure 24S.

FIG. 7 illustrates a structure in accordance with one embodiment of the present application. The illustrated structure shown in FIG. 7 includes a first electrically conductive structure 14S embedded in a first interconnect dielectric material layer 10. A pedestal structure 16S is located on the first electrically conductive structure 14S, wherein the pedestal structure 16S has a flared sidewall, S3, that extends beyond a perimeter of the first electrically conductive structure 14S. A metal-containing structure 18S is located on the pedestal structure 16S. A second electrically conductive structure 24S is located on the metal-containing structure 18S. A second interconnect dielectric material layer 20 is present on the first interconnect dielectric material layer 10 and is located laterally adjacent to the pedestal structure 16S, the metal-containing structure 18S and the second electrically conductive structure 18S. In this embodiment, the second interconnect dielectric material layer 20 contacts a sidewall of each mesa portion 10M of the first interconnect dielectric material layer 10 which is present beneath the flared sidewall, S3, of the pedestal structure 16S.

Figure 8:
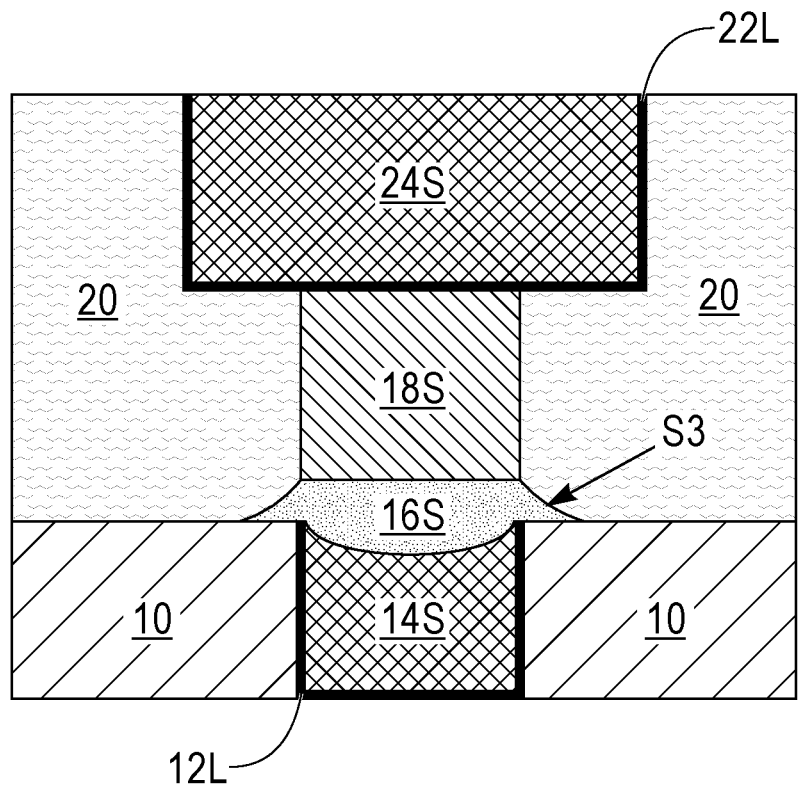
FIG. 8 is a cross sectional view of another exemplary structure of the present application.
Figure 9:
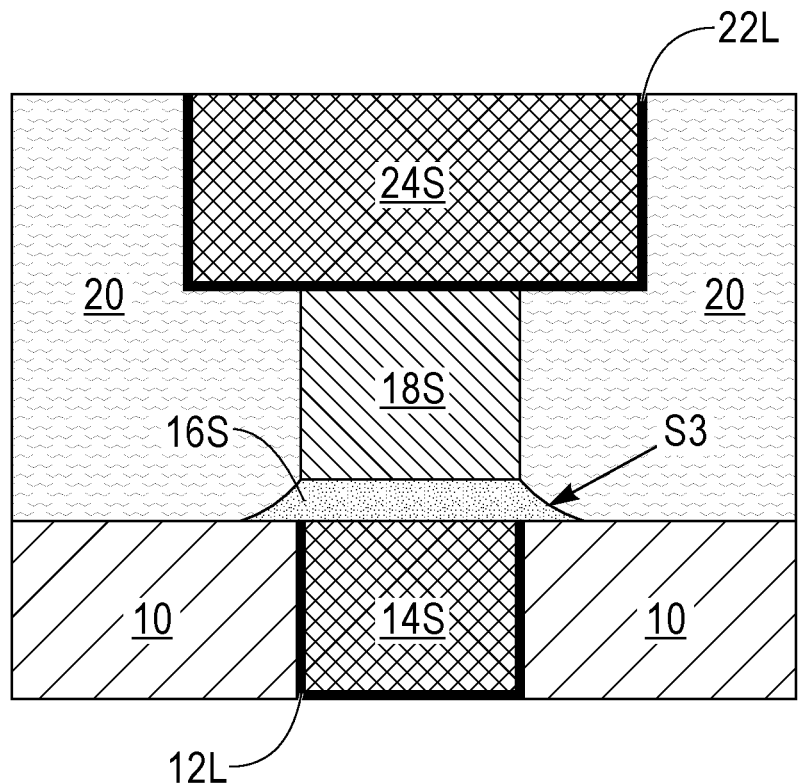
FIG. 9 is a cross sectional view of yet another exemplary structure of the present application.

FIGS. 8-9 illustrate other exemplary structures of the present application. The illustrated structures shown in FIGS. 8-9 include a first electrically conductive structure 14S embedded in a first interconnect dielectric material layer 10. A pedestal structure 16S is located on the first electrically conductive structure 14S, wherein the pedestal structure 16S has a flared sidewall, S3, that extends beyond a perimeter of the first electrically conductive structure 14S. A metal-containing structure 18S is located on the pedestal structure 16S. A second electrically conductive structure 24S is located on the metal-containing structure 18S. A second interconnect dielectric material layer 20 is present on the first interconnect dielectric material layer 10 and is located laterally adjacent to the pedestal structure 16S, the metal-containing structure 18S and the second electrically conductive structure 18S.

In the embodiment shown in FIG. 8, the flared sidewall, S3, of the pedestal structure 16S, is located on a planar topmost surface of the first interconnect dielectric material layer 10. The illustrated structure shown in FIG. 8 can be formed utilizing the same basic processing steps as used in providing the exemplary structure shown in FIG. 7 except that recessing of the first interconnect dielectric material layer 10 is not performed.

In the embodiment shown in FIG. 9, the first electrically conductive structure 14S has a planar topmost surface (i.e., non-recessed) and the flared sidewall, S3, of the pedestal structure 16S, is located on a planar topmost surface of the first interconnect dielectric material layer 10. The illustrated structure shown in FIG. 8 can be formed utilizing the same basic processing steps as used in providing the exemplary structure shown in FIG. 7 except that the structure shown in FIG. 2A is used instead of the structure shown in FIG. 2B and recessing of the first interconnect dielectric material layer 10 is not performed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
   a first electrically conductive structure embedded in a first interconnect dielectric material layer;
   a pedestal structure located on the first electrically conductive structure, wherein the pedestal structure has a flared sidewall that extends beyond a perimeter of the first electrically conductive structure;
   a metal-containing structure located on the pedestal structure;
   a second electrically conductive structure located on the metal-containing structure;
   a second interconnect dielectric material layer present directly on the first interconnect dielectric material layer and located laterally adjacent to, and embedding each of, the pedestal structure, the metal-containing structure and the second electrically conductive structure, wherein the pedestal structure has a lateral dimension that is greater than a lateral dimension of the first electrically conductive structure and the metal-containing structure, and the second electrically conductive structure has a lateral dimension that is greater than the lateral dimension of each of the first electrically conductive structure, the pedestal structure and the metal-containing structure.

2. The structure of claim 1, wherein the pedestal structure is composed of a metal, M, a metal nitride, MN, or alloys of at least two metals, M1-M2, wherein M, M1 and M2 are selected from the group consisting of Ta, Ti, W, Co, Ru, and Rh, and M1 does not equal M2.

3. The structure of claim 1, wherein the metal-containing structure is composed of at least one electrically conductive metal-containing material or a stack of electrically conductive metal-containing materials.

4. The structure of claim 1, wherein the metal-containing structure is composed of elements of a memory stack.

5. The structure of claim 4, wherein the memory stack comprises a ferroelectric memory (FE) stack, a resistive random access memory (ReRAM) stack, a magnetoresistive random access memory (MRAM) stack, or a phase change random access memory (PRAM) stack.

6. The structure of claim 1, wherein the flared sidewall of the pedestal structure extends outward from a topmost surface of the pedestal structure.

7. The structure of claim 1, wherein the flared sidewall of the pedestal structure extends onto a planar topmost surface of the first interconnect dielectric material layer.

8. The structure of claim 1, wherein the flared sidewall of the pedestal structure extends onto a mesa portion of the first interconnect dielectric material layer.

9. The structure of claim 1, wherein the first electrically conductive structure has a concave upper surface, and wherein a bottom surface of the pedestal structure is in direct physical contact with the concave upper surface of the first electrically conductive structure.

10. The structure of claim 1, wherein second interconnect dielectric material layer is in direct physical contact with the flared sidewall of the pedestal structure and a sidewall of the metal-containing structure.

* * * * *